United States Patent [19]

Ugurbil et al.

[11] Patent Number: 5,908,386
[45] Date of Patent: Jun. 1, 1999

[54] FAST MRI FOR ASSESSMENT OF MYOCARDIAL PERFUSION WITH ARRYTHMIA INSENSITIVE MAGNETIZATION PREPARATION

[75] Inventors: Kamil Ugurbil; Nikolaos V. Tsekos, both of Minneapolis; Michael G. Garwood, Medina, all of Minn.

[73] Assignee: Regents of the Universotiy of Minnesota, Minneapolis, Minn.

[21] Appl. No.: 08/766,863

[22] Filed: Dec. 13, 1996

Related U.S. Application Data

[60] Provisional application No. 60/008,642, Dec. 14, 1995.

[51] Int. Cl.$^6$ ..................................................... A61B 5/055
[52] U.S. Cl. ........................... 600/410; 600/419; 324/306
[58] Field of Search ........................... 128/653.2, 653.3; 324/306, 309; 600/410, 419, 420

[56] References Cited

PUBLICATIONS

Haase, A., "Snapshot FLASH MRI. Applications to T1, T2, and Chemical–Shift Imaging", *Magnetic Resonance in Medicine 13*, 77–89, (1990).

Tsekos, N.V., et al., "Fast Anatomical Imaging of the Heart and Assessment of Myocardial Perfusion with Arrhythmia Insensitive Magnetization Preparation", *Magnetic Resonance In Medicine*, 34, 530–536, (1995).

Wilke, N., et al., "Concepts of Myocardial Perfusion Imaging in Magnetic Resonance Imaging", *Magnetic Resonance in Medicine*, 10, 249–286, (1994).

*Primary Examiner*—George Manuel
*Assistant Examiner*—Shawna J. Shaw
*Attorney, Agent, or Firm*—Schwegman, Lundberg Woessner & Kluth P.A.

[57] ABSTRACT

Contrast preparation based on Modified Driven Equilibrium Fourier Transfer generates T1 weighted images for assessment of the myocardial perfusion with contrast agent first-pass kinetics. The preparation scheme produces T1 contrast with insensitivity to arrhythmias in prospectively triggered sequential imaging thereby eliminating one of the major sources of problems in potential patient studies with previously employed contrast preparations schemes.

29 Claims, 10 Drawing Sheets

FAST MRI FOR ASSESSMENT OF MYOCARDIAL PERFUSION WITH ARRYTHMIA INSENSITIVE MAGNETIZATION PREPARATION

This application claims the benefit of U.S. Provisional Application No. 60/008,642 filed Dec. 14, 1995.

STATEMENT REGARDING GOVERNMENT RIGHTS

This invention was made with the support of grants RR08079, HL33600 and HL32427 awarded by the NIH. The U.S. Government has certain rights in the invention.

TECHNICAL FIELD OF THE INVENTION

The present invention relates generally to magnetic resonance imaging, and more particularly, to application of magnetic resonance imaging to the study of myocardial perfusion.

BACKGROUND OF THE INVENTION

Various magnetic resonance imaging techniques in conjunction with administration of exogenous contrast agent (CA) bolus (e.g., see references 1–8 below) have been employed in assessment of myocardial perfusion. One such magnetic resonance imaging technique is a prospectively triggered, fast, repetitive imaging with Inversion Recovery prepared Ultra fast Gradient Recalled Echo (IR-uGRE) sequences. Such an application, however, is sensitive to cardiac arrhythmias which are common, especially when cardiac disorders are present. T1-weighted images are used to monitor the contrast agent. During consecutive T1-weighted image acquisition to monitor the first-pass through of the contrast agent through the myocardium, the magnetization sampled by the IR-uGRE sequence depends upon the extent of T1 relaxation which occurs following acquisition of the image data in the previous cardiac cycle. For a constant heart rate, the extent of T1 relaxation between images is constant. During arrhythmia, however, the change in R—R interval allows a different amount of T1 relaxation to occur between images. As a consequence, the signal intensity and contrast detected as a function of time is modulated by sources other than the passage of the CA. In other words, an arrhythmia of the heart is a source other than the passage of the CA that modulates the amount of T1 relaxation. Since a relatively good time resolution is desired, especially with perfusion imaging where the brief passage of the CA through the myocardium is monitored, the problem encountered by the arrhythmias cannot be solved by retrospective gating without loss of information.

Prospectively triggered, magnetization prepared fast imaging sequences (e.g. Ultra fast gradient recalled echo, EPI, Spiral etc.) are increasingly employed for cardiac imaging. When magnetization preparation has to be repeated rapidly in consecutive acquisitions as encountered in anatomical imaging of the heart acquired with k-space segmentation or in assessment of myocardial perfusion in conjunction with administration of exogenous contrast agent (CA) bolus, the image signal intensity becomes sensitive to cardiac arrhythmias which are common especially when cardiac disorders are present. During prospectively triggered consecutive data acquisitions, the magnetization sampled depends upon the extent of T1 relaxation which occurs following acquisition of the previous imaging data. This is independent of whether the contrast is based on T1, T2 or T2*. For a constant heart rate, the extent of T1 relaxation between images is constant. During arrhythmia, however, the change in R—R interval allows a different amount of T1 relaxation to occur between images. Consequently, the signal intensity and contrast detected as a function of time is modulated.

Therefore, there is a need for a magnetic resonance imaging process for use on myocardial regions of interest in which T1 relaxation is not affected by arrhythmias of the heart. There is also a need for a process which is not dependent on former readings from the heart. Yet another need is a process for producing myocardial perfusion images which are not affected by arrhythmias of the heart. If such a process were available the images signal intensity and contrast detected would not be modulated. The result would be more accurate and consistent magnetic resonance images that could be used to provide for a more accurate representation of the perfusion of the heart under study with MRI.

SUMMARY OF THE INVENTION

An MRI magnetization preparation process produces T1 weighting independent of the magnitude of the prior longitudinal magnetization in a region of interest. The MRI magnetization preparation process commences with nulling of the longitudinal magnetization prior to the onset of additional contrast preparation pulses or delays. Subsequent imaging preparation pulses can then be applied to the region of interest with the knowledge that the longitudinal magnetization was zero prior to the subsequent imaging preparation pulses. A number of patterns of magnetization preparation pulses can then be applied to the region of interest and T1 can be measured at a time after nulling the longitudinal magnetization. The magnetization preparation process makes the magnetic resonance imaging independent of heart arrhythmias. Rather than basing the T1 relaxation time on the irregular R—R signal from a heart associated with an arrhythmia, the T1 relaxation time is dependent on the passage of time from an induced state, namely a nulled starting longitudinal magnetization. This approach is used in conjunction with magnetization prepared Ultra fast gradient recalled echo image acquisition to generate T1-weighted anatomical images of the heart and to assess the myocardial perfusion state in conjunction with the administration of exogenous contrast agent bolus.

A method for obtaining myocardial perfusion images of a region of myocardial tissue using magnetic resonance imaging, includes the step of applying one or more magnetic pulses to induce an initial magnetic condition on the region of myocardial tissue being imaged. After inducing the initial magnetic condition on the region of interest, a series of magnetic resonance imaging events depend on the initial magnetic starting point. Since these image events all have the same initial magnetic starting point, successive images are unaffected by other events such as arrhythmias of the heart. Several methods can be used to induce the initial magnetic condition.

One method for obtaining images of a region using magnetic resonance imaging comprises the steps of applying a nulling pulse to a region of the myocardial tissue to null the longitudinal magnetization. The nulling pulse induces the region of interest to a known, repeatable initial magnetic state. After the nulling pulse, the longitudinal magnetization is sampled.

Another method for obtaining images of a region of tissue using magnetic resonance imaging comprises the steps of applying a nulling pulse to null the longitudinal magnetization, applying a first spoiling pulse to spoil the transverse magnetization generated by the nulling pulse, applying an inverting pulse to invert the magnetization at a time ti1 after the nulling pulse, applying a second spoiling pulse to spoil the transverse magnetization generated by the inverting pulse, and sampling the longitudinal magnetization after the step of applying the second spoiling pulse at a time ti2 after the inverting pulse, wherein ti1 is not equal to ti2.

Advantageously, the magnetic resonance imaging process for use on myocardial regions of interest is not affected by arrhythmias of the heart. Since the process begins with nulling the T1 magnetization, the subsequent imaging events are not dependent on former readings from the heart. Myocardial perfusion images which are not affected by arrhythmias of the heart can be produced.

DETAILED DESCRIPTION OF THE INVENTION

ANIMAL MODEL

Figure 1A:
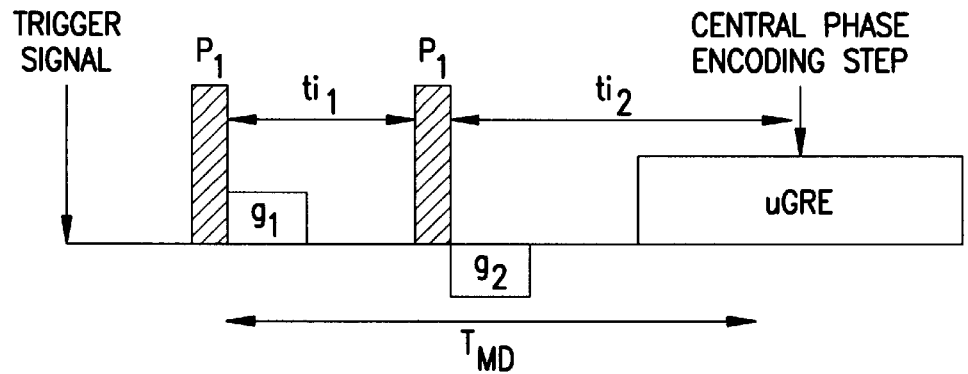
FIG. 1A is a diagram of the MDEFT-uGRE pulse sequence.

Animal Model: Dogs (n=6, 12–15 Kg) were surgically instrumented as described elsewhere (see reference 6) by inserting catheters in the left ventricle (LV), ascending aorta (AO), left atrium (LA) and femoral vein, for pressure monitoring, microspheres injection and CA injection, respectively. Occlusions were induced by a hydraulic occluder placed around the LAD coronary artery proximal to a doppler flow meter which was used for verification of the intervention. Microspheres for blood flow measurements were injected to validate retrospectively the efficiency of the occlusions. Microsphere injection protocol and blood flow calculations were performed as previously described (see reference 6).

Magnetic Resonance Imaging: All animal MRI experiments were conducted on 4.7 T/40 cm SIS Co. system, using a magnetization prepared Ultra fast gradient recalled echo (uGRE) sequence with RF spoiling. A surface coil was used for both RF transmission and signal reception. In order to achieve B1 independent contrast, the pulses in the MDEFT preparation were adiabatic half-passage (Amplitude/Phase modulation functions: hyperbolic tan/tangent and R=120) and inversion pulses (modulation functions: sech/tanh and R=16) as described in (see reference 9). In all studies, the field of view was 14×14 cm and the slice thickness was 7 mm; the slice was defined suing a Gaussian shaped excitation pulse. Two different imaging protocols were employed; first for anatomical imaging and second for first pass contrast agent studies.

For acquiring high resolution anatomical images (protocol #1) of the canine heart, the uGRE sequence was implemented with eight k-space segments, each covering 16 phase encoding steps per heart cycle (TR/TE/a=4/2.8 ms/10°, 256×128 acquisition matrix). The 180° pulse in the MDEFT preparation pulse P2 in FIG. 1) was slab selective (slab thickness=14 mm) to reduce saturation of the blood in the cardiac chambers and consequently distinguish them with better contrast from the myocardial wall.

For monitoring contrast agent first pass in animal studies (protocol #2), the sequence was implemented without segmentation (TR/TE/a=3.4 ms/2.4 ms/10°, 128×64 acquisition matrix) and both 90° and 180° pulses were non-selective to provide more efficient nulling of the signals from both the myocardium and the ventricular chambers. Prospectively triggered images were sequentially collected (up to 120 images) every second or third heartbeat. Consecutive image acquisition every heartbeat was precluded, even when contrast preparation and image collection was achieved in a single heartbeat, due to hardware limitations imposed by the slow data transfer rates from the acquisition board to the host computer. After the acquisition of 30 to 40 images initially as "baseline", a bolus of 0.07 mmol/Kg Gd-DTPA (Magnevist, Berlex) followed by 10 ml of saline flush were injected in the left atrium through an implanted catheter in the animal model studies. The images were analyzed using arbitrarily shaped Regions of Interest (ROIs) to conform to the local shape of the myocardium. The signal intensity (SI) time curves for each ROI were normalized to the intensity observed during baseline.

HUMAN STUDY

Human studies were conducted on a 1.5T Siemens Vision system using an unsegmented magnetization prepared Ultra fast gradient recalled echo (uGRE) sequence (TR/TE/a=5.9/3.5 ms/10°, 128×100 acquisition matrix, FOV=23×23 cm, slice thickness=10 mm) to follow the first pass of 0.03 mmol/Kg Gd-DTPA (Magnevist, Berlex). All human studies were conducted under a protocol approved by the institutional review board of the University of Minnesota Medical School.

TECHNIQUE

A magnetization preparation scheme which commences with nulling of the longitudinal magnetization prior to the onset of additional contrast preparation pulses or delays is used. Thus, the magnetization preparation preceding the k-space sampling can be expressed as [(Mz-nulling with subsequent dephasing of transverse magnetization)–(additional spin manipulation)–(k-space sampling)]. Nulling can be achieved by a variety of pulses, such as 90 degree pulse (square hard pulse, amplitude modulated hard pulse, adiabatic excitation pulse, etc.).

Before k-space sampling, nulling can be followed by additional spin transformation and evolution that can include i) a delay, for T1 contrast, ii) delay—180 degree pulse—delay, for T1 contrast, iii) delay—slice selective 180 or 90 degree pulse—delay, combined with a second scan with delay—non-slice selective 180 or 90 degree pulse—delay, for flow/perfusion based imaging without the use of contrast agents, iv) delay—90 pulse-delay, for T2* contrast that would evolve during the second delay period, v) delay—{90-t-(minus 90)}—delay for T2* contrast that evolves during period t and is restored to the z-direction to be then sampled by subsequent imaging, vi) delay—{(90)-t-180-t-(minus 90)} for T2 contrast, etc. In these schemes, the transverse magnetization that may be generated after nulling is "crushed" by dephasing and longitudinal magnetization that evolves is what is further prepared for contrast by the subsequent pulses and delays. This general scheme that starts out with longitudinal magnetization nulling leads to signal intensity and contrast that is always independent of variations in image acquisition rate and consequently of heart arrhythmias or any other application where non-constant image acquisition rates are dictated.

The magnetization prepared uGRE pulse sequence is diagrammatically illustrated in FIG. 1A. The magnetization preparation is analogous to the pulse sequence referred to as Modified Driven Equilibrium Fourier Transform (MDEFT), originally used for solvent suppression (see reference 10) and recently employed at high magnetic fields to generate improved T1 weighted anatomical images of human brain (see references 11, 12). In the present invention, the pulse sequence is used to force a known magnetic initial condition or induce an initial magnetic condition on the region of myocardial tissue being imaged. The MDEFT contrast preparation consists of two preparation pulses (P1, P2) and two evolution periods (ti1, ti2). The initial pulse (P1) is a 90° pulse which nulls the longitudinal magnetization. The transverse magnetization generated must be eliminated which is accomplished by a spoiling gradient (g1). Because of the null starting point, the evolution of the longitudinal magnetization towards thermal equilibrium during the period ti1 is independent of the history of previous pulses. The magnetization is then inverted by the second pulse (P2); the transverse components generated by imperfections of this pulse and the echoes that can be generated by the combination of the two pulses are spoiled with a second gradient pulse (g2). After a second longitudinal relaxation evolution period (ti2) from the pulse P2, the longitudinal magnetization is sampled; at this time, the longitudinal magnetization, Mz(ti1, ti2), is described by the equation:

$$M_z(ti_1, ti_2) = M_o(1 - 2\exp(-ti_2/T_1) + \exp(-(ti_1+ti_2)/T_1))  \quad [1]$$

When a uGRE sequence is used for image acquisition, ti2 is defined as the time duration between the pulse P2 and the central phase encoding step as illustrated in FIG. 1A, which predominantly determines the contrast of the image. Any low angle excitation pulses of the uGRE sequence executed prior to the central phase encoding steps will decrease the longitudinal magnetization to [Mz(ti1, ti2) cos a] followed by continued relaxation, leading to the well-recognized reduction in intensity for consecutive k-lines sampled. This perturbation will diminish with decreasing excitation pulse angle since cos a ~1 for small a and would be further minimized by a centric phase encoding scheme; it would be eliminated with use of single shot sequences such as Echo Planar Imaging (EPI). The total preparation period for MDEFT is defined as TMD=ti1+ti2. The signal detected is, of course, equal to [Mz(ti1, ti2) sin a] with a $\leq 90°$ unless a single shot sequence like EPI is used.

The insensitivity of sequential MDEFT imaging to cardiac arrhythmias or failures of the triggering system is ensured by the presence of the initial preparation 90° pulse (P1). In contrast, the magnetization sampled at each observation by a series of IR based sequences is determined by the inversion time (TI) and by the repetition time (Tri) of the preparation/observation sequence during consecutive image acquisition. With prospective triggering, Tri is determined by the temporal duration of the heart cycle.

Any pulse sequence used, such as the one shown in FIG. 1A and described above, can be programmmed into a processor unit associated with the computer of the magnetic resonance imaging system. The basic pulse sequence is typically stored in the computer and the timings between delivery of these pulses can be either fixed or variable depending on the program. In most instances, the timing between the pulses is variable so that the different timings in a pulse sequences can be used to produce different images as needed. Such a program may come resident on a new MRI system. MRI systems without such a sequence can be updated by uploading the sequence from a computer readable medium like an electronic medium, such as a bulletin board or via the internet, or from some other computer readable medium, such as floppy disk, optical disk, CD-ROM or the like.

Figure 1B:
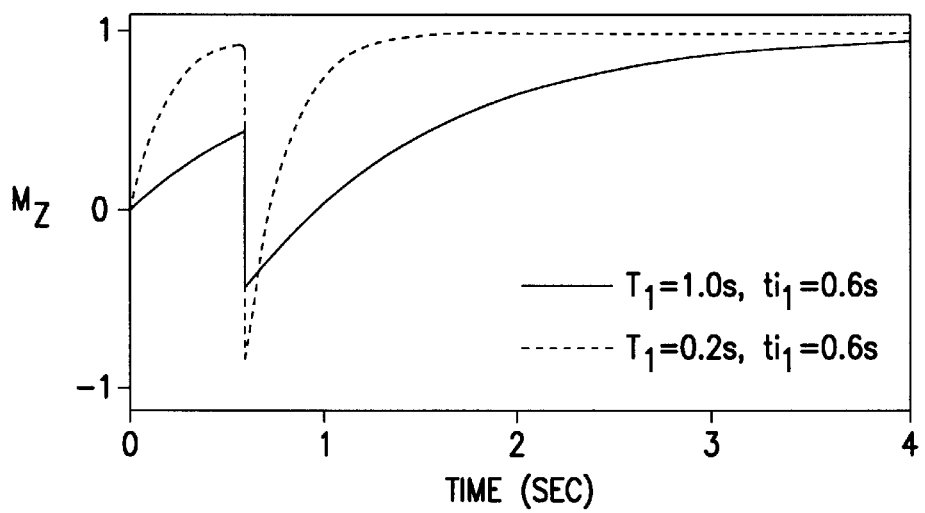
FIG. 1B is a diagram of the longitudinal magnetization plotted with respect to time where T1 changes and ti1 stays the same.

FIG. 1B illustrates the simulated evolution of Mz during an MDEFT preparation period with ti1=0.6 sec for a long (1 s) and a short (0.2 s) T1 value. As in conventional IR preparation, reduction of the T1 relaxation time of the tissue results in increasing magnetization and thus signal enhancement. For optimal contrast between the ischemic and the normally perfused tissue during CA first-pass evaluation, approximate nulling of both the myocardial and the blood signal is desired prior to CA administration (e.g., see reference 1). In the MDEFT preparation, this is accomplished by adjusting the ti1 and ti2 parameters. With either ti2 or ti1 fixed, the magnitude of the other parameter for achieving signal nulling, ti1o and ti2o, respectively, can be calculated from Eq. [1]:

$$ti_{1o} = T_1 \ln(1/(2\exp(-ti_2/T_1)-1)) - ti_2 \quad [2]$$

$$ti_{2o} = T_1 \ln(2 - \exp(-ti_1/T_1))$$

FIG. 1B shows the simulation of the evolution of the longitudinal magnetization (Mz) after the 90° pulse in the Modified Driven Equilibrium Fourier Transform (MDEFT) preparation demonstrating the effect of T1 relaxation time. The simulation corresponds to MDEFT implemented with ti1=600 ms for T1=1 s and T1=200 ms. In the simulation, the discontinuous inversion of the signal intensity occurs due to the application of the 180° pulse in the MDEFT preparation. All calculations assumed sampling of the longitudinal magnetization with a single excitation pulse. [3]

Figure 1C:
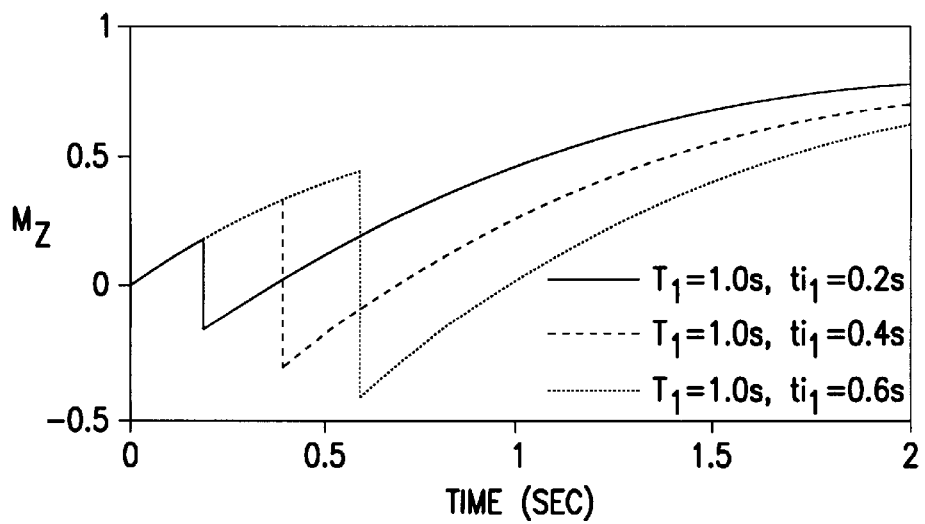
FIG. 1C is a diagram of the longitudinal magnetization plotted with respect to time where T1 stays the same and ti1 changes.

The evolution of the Mz during an MDEFT preparation with different ti1 values is illustrated in FIG. 1C. For each ti1, there exists a ti2o value which nulls the magnetization of a given T1, and longer ti1 requires correspondingly longer ti2o for signal nulling, resulting in the elongation of the preparation period. In contrast, the nulling point of the simple IR sequence is defined by the temporal heart rate and the acquisition parameters.

FIG. 1C shows a simulation of the evolution of the longitudinal magnetization (Mz) after the 90° pulse in the Modified Driven Equilibrium Fourier Transform (MDEFT) preparation demonstrating the effect of changing the parameter ti1. The simulation (C) corresponds to T1=1 s and MDEFT with ti1 values of 200, 400 and 600 ms. In the simulation, the discontinuous inversion of the signal intensity occurs due to the application of the 180° pulse in the MDEFT preparation. All calculations assumed sampling of the longitudinal magnetization with a single excitation pulse.

Figure 2A:
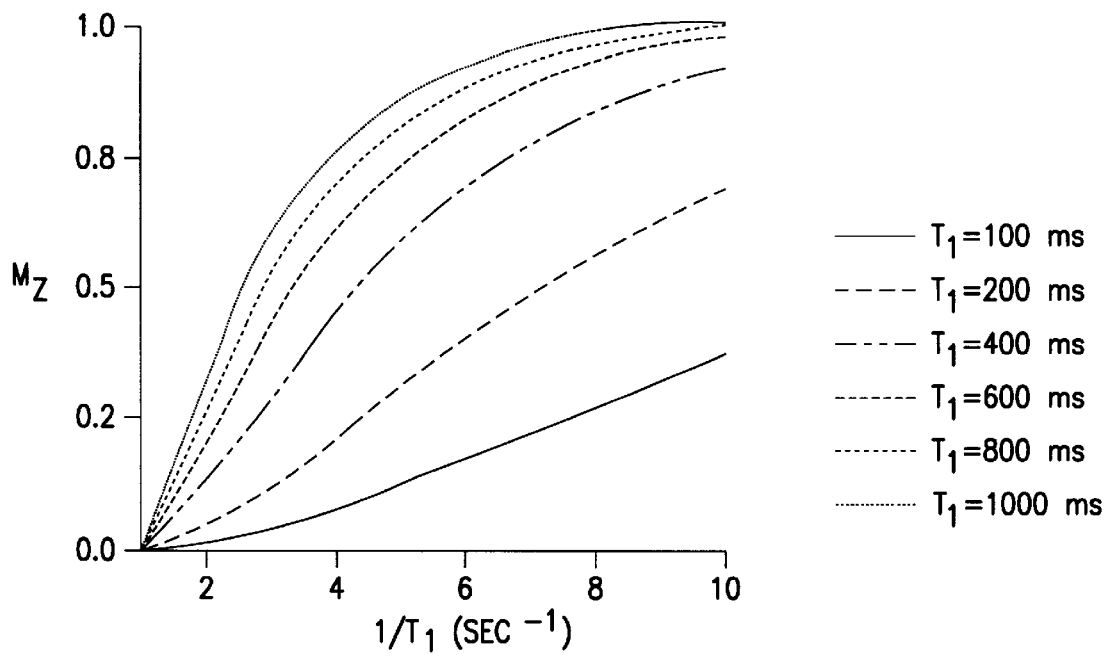
FIG. 2A is a diagram of the magnetization plotted with respect to 1/T1 where there are different ti1 and ti2 values.
Figure 2B:
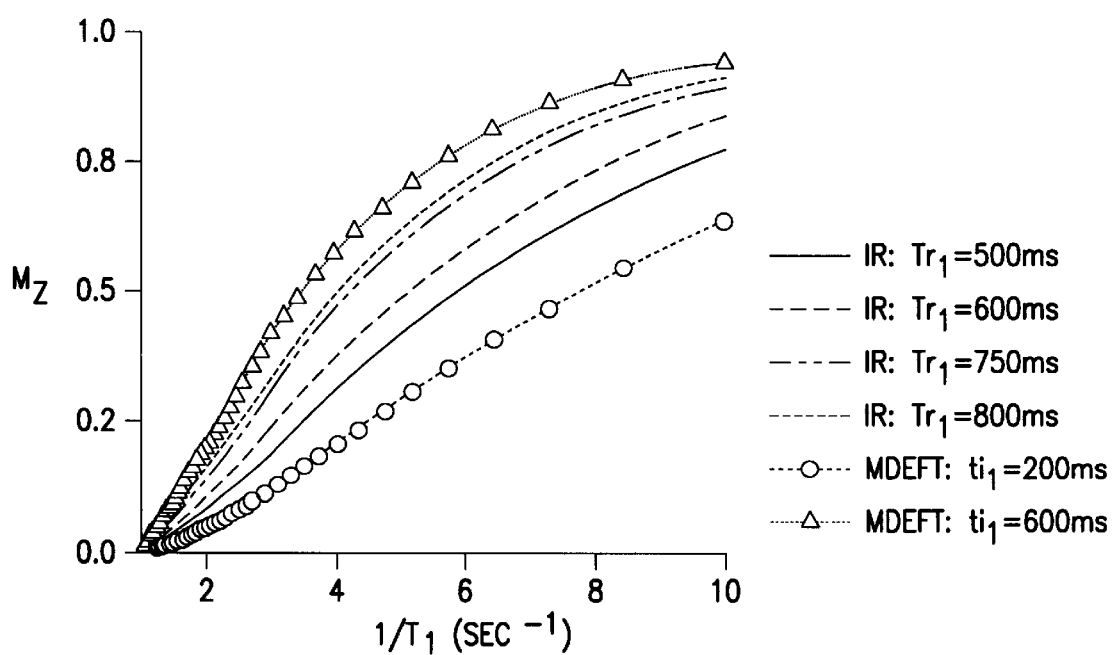
FIG. 2B is a diagram of the magnetization plotted with respect to 1/T1 where there are different image repetition times, Tri.

FIG. 2A illustrates simulations of the enhancement that can be produced with the MDEFT contrast preparation during CA first pass. The graph depicts the Mz prepared by MDEFT with different ti1 and ti2 evolution periods; for each ti1, ti2 was adjusted so that the signal detected was nulled for a T1 value of 1 sec. These plots demonstrate the signal enhancement that would be observed if the T1 decreases to less than 1 sec as would be expected during the passage of the CA; longer preparation periods are clearly advantageous for improved signal enhancement. For comparison, the enhancement produced by a prospectively triggered IR sequence is illustrated in FIG. 2B together with two different MDEFT preparations. The Mz for the IR sequence was calculated using the expression:

$$M_z = M_o[1 - 2\exp(-TI/T_1) + \exp(-Tr_i/T_1)] \quad [4]$$

with Tri values corresponding to heart rates of 75 bpm (Tri=80 ms) or 120 bpm (Tri=500 ms). TI was adjusted to null the magnetization for T1 of 1 sec. Alterations of the Tri (which must equal an integer multiple of the heart rate) cause changes in the magnetization, especially at lower T1 values that would be applicable during the period of CA passage. The plots in FIG. 2 demonstrate the longitudinal magnetization available for sampling by the acquisition sequence. With the uGRE sequence only a portion of this magnetization is sampled, namely Mz sin (a), during the collection of each of the k-space lines; only EPI, with 90° excitation angle, will acquire the total available magnetization.

The previous imaging applications of MDEFT in T1 weighted anatomical imaging of the brain at high magnetic fields employed equal evolution periods, i.e. ti1=ti2=ti=TMD/2, to produce highly T1-weighted images (see references 11, 12) when the signal dependence is given by:

$$M_z = M_o(1 - \exp(-ti/T_1))^2 \quad [5]$$

This condition cannot be used for first pass CA studies because of the desire to null the signal prior to CA passage and because T1 of the tissue is substantially reduced in the presence of the CA. This condition, however, can be employed with magnetization prepared Ultra fast gradient recalled echo sequence for anatomical T1 weighted images of the heart.

FIGS. 2A and 2B show simulations of the signal change due to variations in T1 in MDEFT preparations with different ti1 and ti2 values (see FIG. 2A), and in IR sequence with different image repetition time Tri (see FIG. 2B). FIG. 2B also displays two MDEFT preparations [(ti1=200 ms; ti2=166 ms) and (ti1=600 ms; ti2=372 ms)] for direct comparison with the IR data. In both cases, the Mz was set to be nulled at the end of the preparation period for the T2 value of 1 s by adjusting the sequence parameters. For MDEFT (A), for each parameter ti1 (100, 200, 400, 600, 800, and 1000 ms) the corresponding ti2o values (91, 166, 285, 372, 439, and 489 ms, respectively) were calculated using Eq. [3] to achieve nulling for T1=1 sec. For the IR sequence, for each value of the parameter Tri (500, 600, 750, and 800 ms) the corresponding T1 values (220, 256, 307, and 322 ms, respectively) were calculated by solving Eq. [4] for Mz=0 at the end of preparation for T1=1 s. All calculations assumed sampling of the longitudinal magnetization with a single excitation pulse.

RESULTS AND DISCUSSION

Figure 3A:
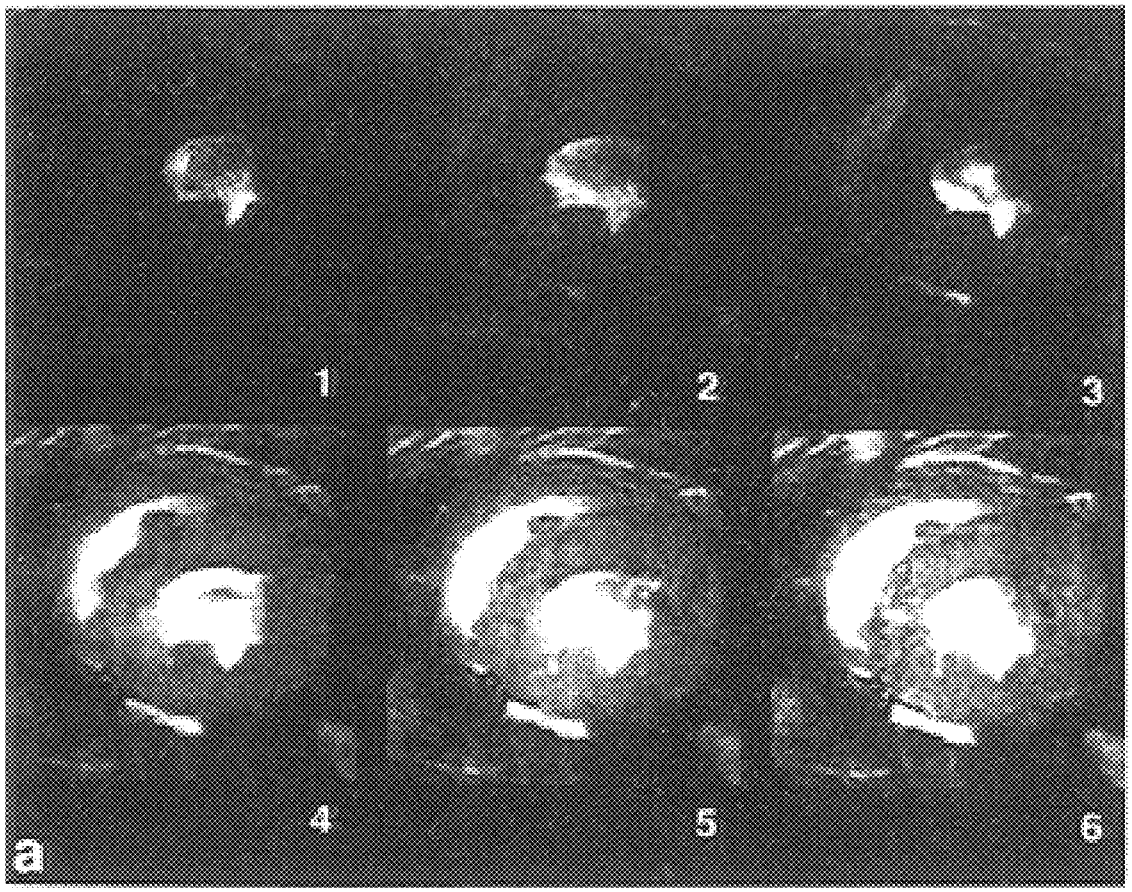
FIG. 3A is a series of magnetic resonance images showing the effect of MDEFT evolution period TMD/2=ti1=ti2 on the image contrast.
Figure 3B:
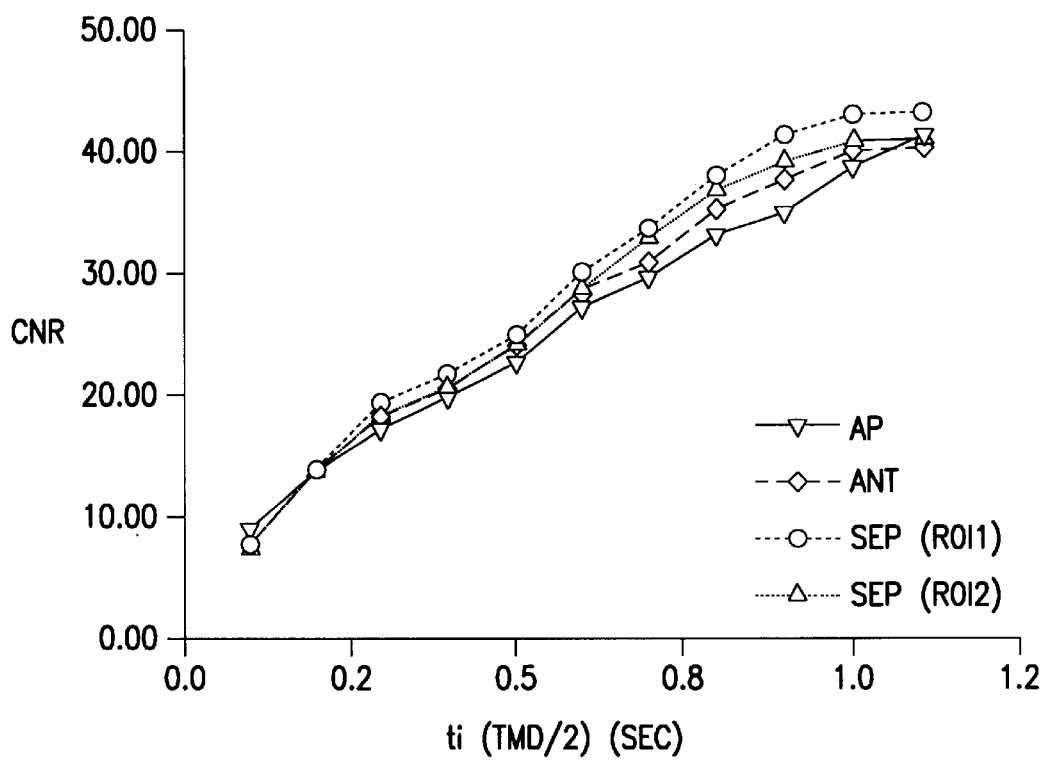
FIG. 3B is a diagram of CNR verses ti (TMD/2).

FIG. 3 presents a panel of selected T1-weighted diastolic images of the canine heart acquired with the anatomical imaging protocol (#1) demonstrating the effect of the evolution periods ti1 and ti2 on the MDEFT prepared segmented uGRE sequence. The MDEFT preparation was implemented with equal evolution periods, i.e., ti=ti1=ti2=TMD/2. The images were collected sequentially with increasing ti value and without any delays between successive repetitions of the imaging sequence. The parameters ti1 and ti2 were incremented from 100 ms to 1.1 sec together with the delay between the trigger signal and the onset of the MDEFT preparation to ensure that acquisition is centered at the same heart phase independent of the ti value. At short TMD values, the blood remains within the cavities during the execution of both preparation pulses P1 and P2, thereby suffering a reduction in signal intensity. However, at longer TMD values spanning a diastolic phase, the cavity signal increases faster relative to the myocardium due to flow, yielding increased contrast between the myocardial wall and the cavities. This is illustrated in FIG. 3B, where the contrast-to-noise ratio (CNR) of selected myocardial ROIs with respect to an LV cavity ROIs is plotted as a function of TMD/2.

FIG. 3A shows the effect of the MDEFT evolution period TMD/2=ti1=ti2 on the image contrast. FIG. 3B shows the CNR curves of myocardial Regions of Interest (ROIs). The images 1 to 6 of FIG. 3A correspond to ti values of 100, 300, 500, 700, 900, and 1100 ms, respectively. The CNRs of FIG. 3B were calculated relative to adjacent LV chamber ROIs.

Figure 4:
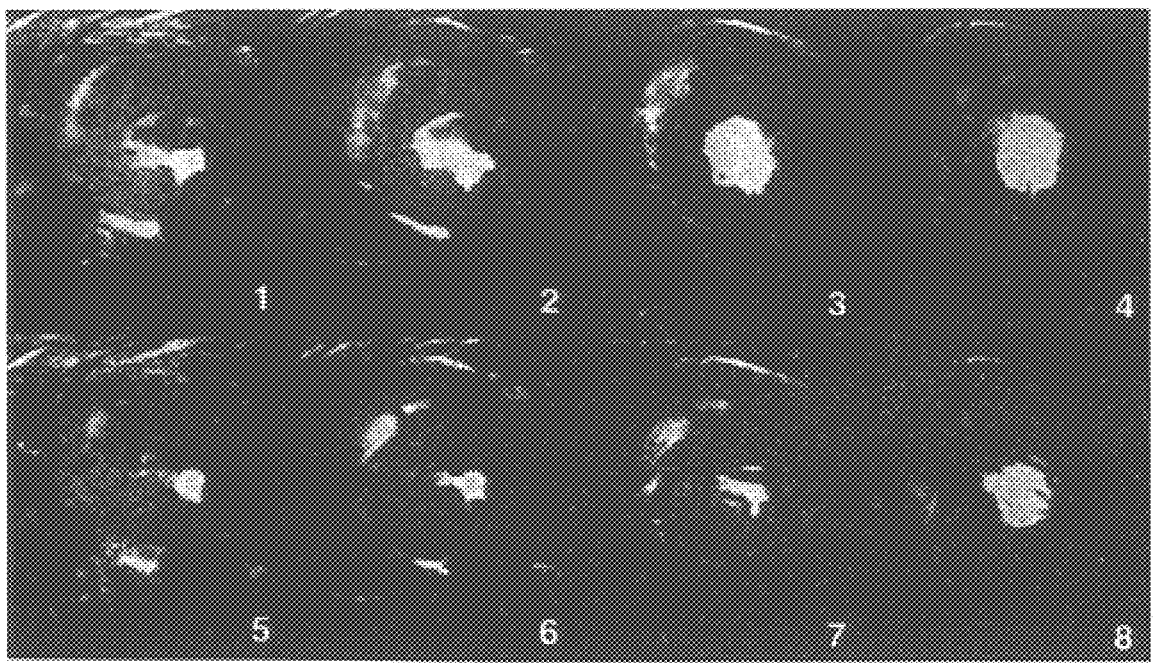
FIG. 4 is a series of images from short axis view form a multislicc/multicardiac-phase high resolution set.

FIG. 4 shows selected images from short axis view from a multislice/multicardiac-phase high-resolution set acquired with a segmented MDEFT-uGRE sequence (ti1=ti2=TMD/2=400 ms). The central phase encoding step of the uGRE sequence was centered either at end diastole (images 1 to 4) or at the end of systole (images 5 to 8). The various images show selected T1-weighted (protocol #1) canine heart images from a different study where a multislice set was acquired with the segmented MDEFT-uGRE (ti=TMS/2=400 ms) with the central phase encoding step centered at either diastole (images 1 through 4) or systole (5 through 8). Images 1 and 5 depict apical views and images 4 and 8 basal views of the heart; the planes 2–6 and 3–7 correspond to intermediate positions. The same slice is illustrated for the systolic and diastolic phases. The clear delineation of the inner and outer left ventricular wall boundaries indicates that quantitative information such as contraction induced ventricular volume changes and wall thickening can be calculated from these images. Since at this particular case TMD=800 ms, the images were collected skipping at least a heart cycle (depending on the temporal heart rate) allowing time for the MDEFT preparation.

Figure 5:
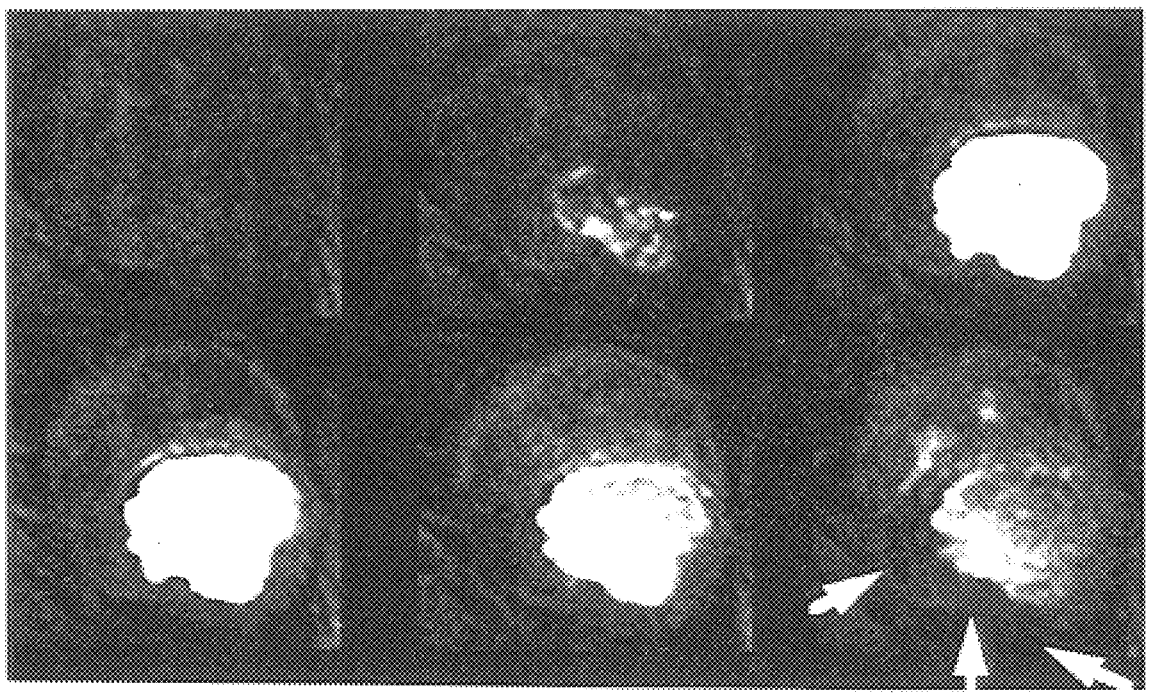
FIG. 5 is a series of myocardial perfusion images from short axis view during LAD occlusion at selected times during CA first pass.

FIG. 5 demonstrates images of the first pass of a CA bolus through the canine heart using an MDEFT=uGRE sequence acquired with the contrast enhanced first pass protocol (protocol #2), with ti1=200 msec and ti2=165 msec, during an LAD occlusion intervention. The total time for the MDEFT preparation and the uGRE acquisition was 475 ms per image. Nulling of the signal from both the LV cavity and the myocardium was possible as shown in the baseline image at the upper left-hand corner. The occluded perfusion bed (arrows) represented by the anterior wall (ANT) and the anterior papillary muscle (AP), is visible as a darker area compared to the normally perfused wall due to a lack of signal enhancement by the CA passage. Microspheres analysis verified that the blood flow decreased from 0.51 to 0.05 ml/min/gr in ANT and from 0.61 to 0.01 ml/min/gr in AP, corresponding in both cases to virtual total loss of perfusion, while the septal wall (SE) demonstrated hyperperfusion (0.559 to 0.769 ml/min/gr).

FIG. 5 shows myocardial perfusion images from short axis view during LAD occlusion at selected times during CA first pass. A very short MDEFT preparation (ti1/ti2=200/135 ms) was used allowing preparation and image acquisition within a single heartbeat (heart rate 160 bpm). The relative lack of signal enhancement by the CA passage in the anterior wall and anterior papillary muscle is apparent (arrows) in the images.

FIG. 6 illustrates the SI time curves of selected ROIs during LAD coronary artery occlusion in the study of FIG. 5. FIG. 6A displays an ROI located in the LV chamber whereas three ROIs within the myocardium are plotted together using different symbols in FIG. 6B. The SI of the LV chamber ROI depicts the sharp first pass of the CA as well as the subsequent recirculation. The occluded tissue (AP and ANT) demonstrate first-pass time curves with delayed and reduced SI enhancement typical of hypoperfused myocardium (e.g., see reference 2).

Figure 6A:
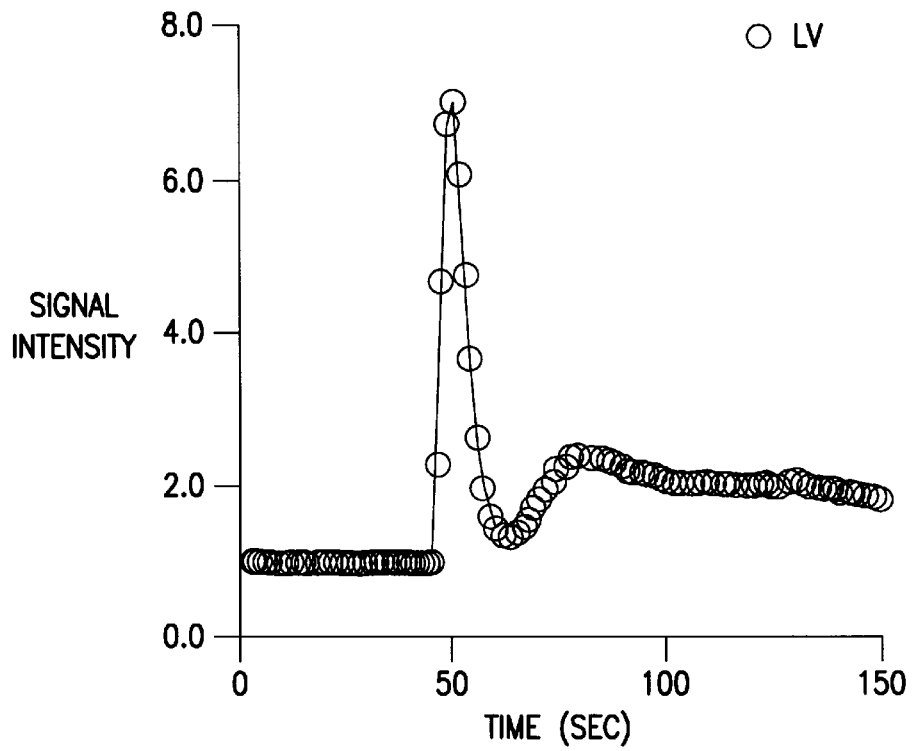
FIG. 6A is a diagram of the signal intensity verses time of a representative Region of interest (ROI) during the first pass of Gd-DTPA from the study of myocardial perfusion images from short axis view during LV control.
Figure 6B:
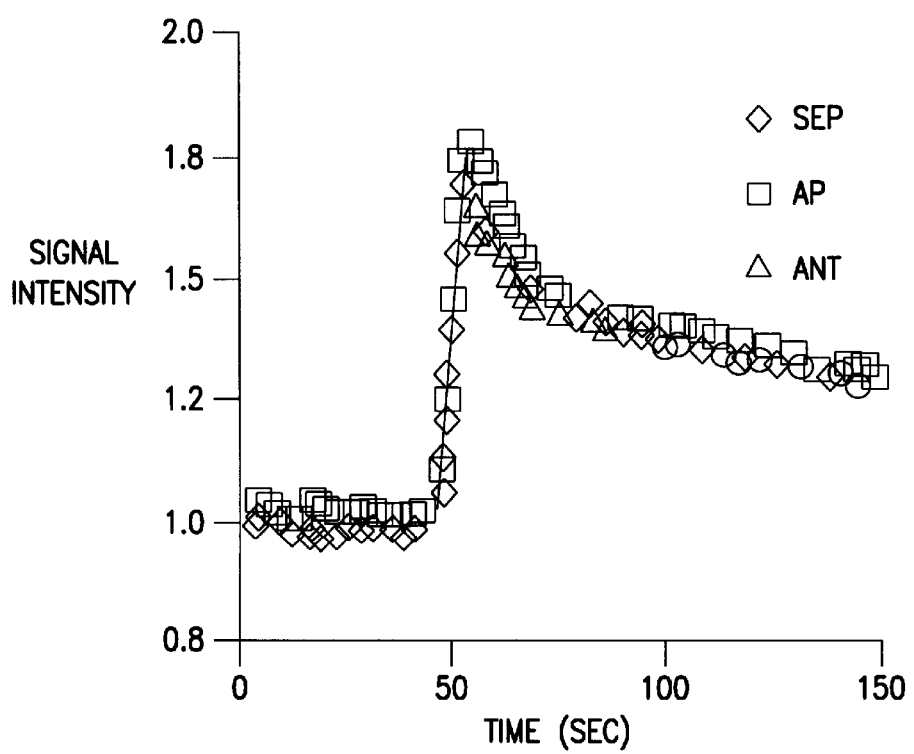
FIG. 6B is a diagram of the signal intensity verses time of a representative Region of interest (ROI) during the first pass of Gd-DTPA from the study of myocardial perfusion images from short axis view during LV, SEP, AP and ANT control.
Figure 6C:
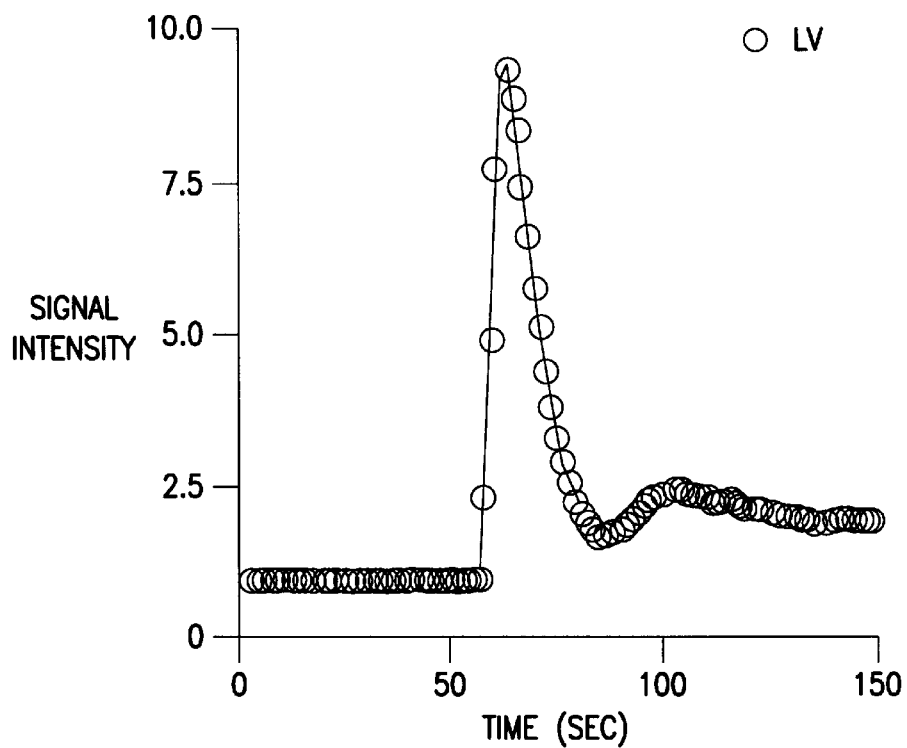
FIG. 6C is a diagram of the signal intensity verses time of a representative Region of interest (ROI) during the first pass of Gd-DTPA from the study of myocardial perfusion images from short axis view during LAD occlusion.
Figure 6D:
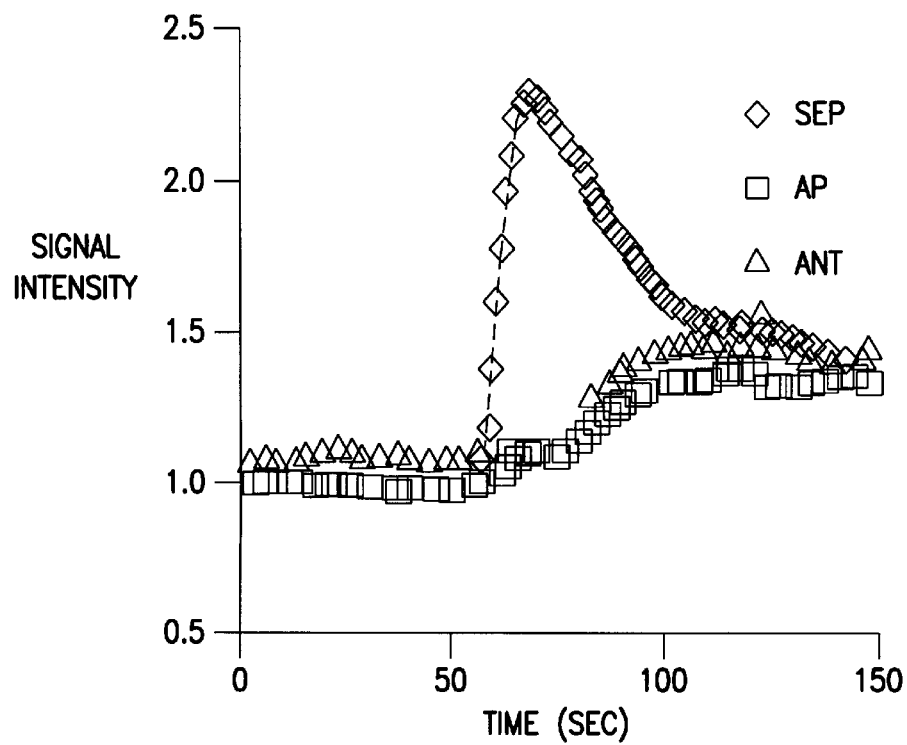
FIG. 6D is a diagram of the signal intensity verses time of a representative Region of interest (ROI) during the first pass of Gd-DTPA from the study of myocardial perfusion images from short axis view during LV, SEP, AP, and ANT occlusion.

FIGS. 6A, 6B, 6C and 6D are signal intensity time curves of representative ROIs during the first pass of Gd-DTPA in the study presented in FIG. 5, during control (FIGS. 6A and 6B) and occlusion (FIGS. 6C and 6D) with MDEFT (ti1/ti2=200/135 ms) in A, C, LV chambers. FIGS. 6B and 6D show the signal intensity time curves associated with the myocardium.

Figure 7:
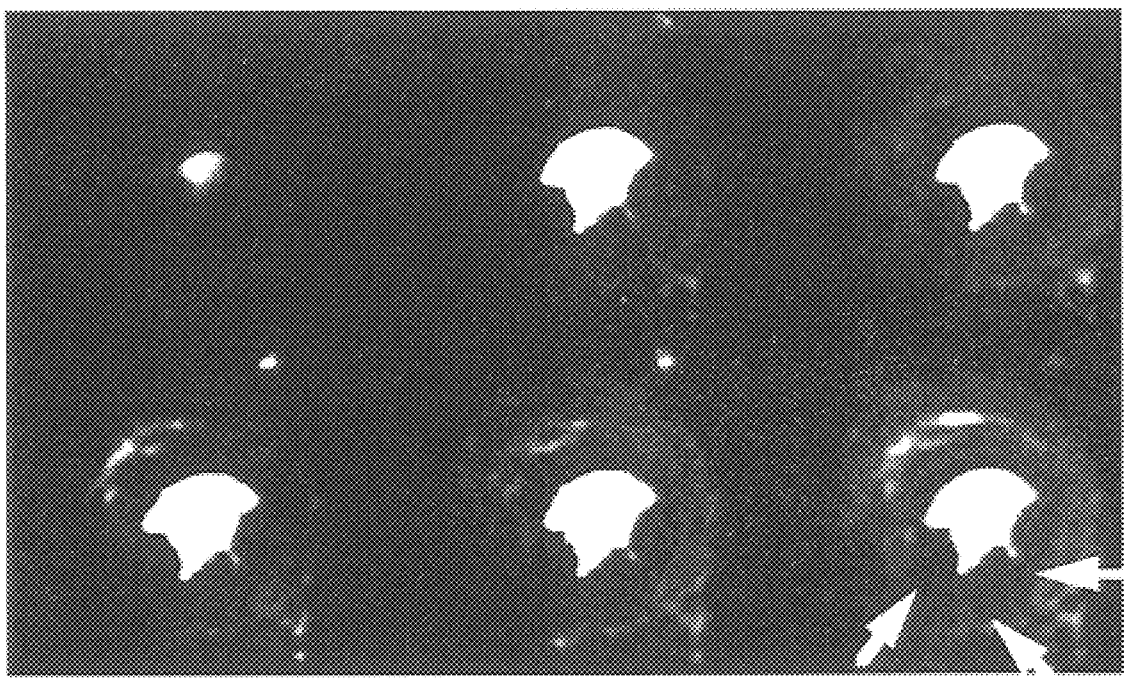
FIG. 7 is a series of myocardial perfusion images from short axis view during LAD occlusion with a long MDEFT.

FIG. 7 presents a panel of canine heart images showing the first pass SI enhancement using longer preparation times ti1=600 ms and ti2=380 ms, acquired in the presence of LAD coronary artery occlusion. The ANT wall and the AP muscle demonstrate minimal SI enhancement (arrows), during the passage of the CA, relative to the rest of the tissue. Although the required time for preparation and acquisition at this implementation was 1090 ms per image spanning more than one heartbeat at the high heart rates of anesthetized instrumented canine preparation, better contrast of the occluded perfusion bed and delineation of the heart anatomy is achieved. Microspheres analysis indicated that the ANT suffered a flow reduction from 0.49 to 0.23 ml/min/gr and AP muscle from 0.57 to 0.43 ml/min/gr in this case. This partial reduction in flow was clearly visualized in the MDEFT prepared images of CA passage (FIG. 7).

FIG. 7 shows myocardial perfusion images of a short axis view during LAD occlusion with a long MDEFT (ti1/ti2= 600/350 ms) preparation. The hypoperfused bed represented by the anterior wall and anterior papillary muscles is indicated by the arrows.

Figure 8:
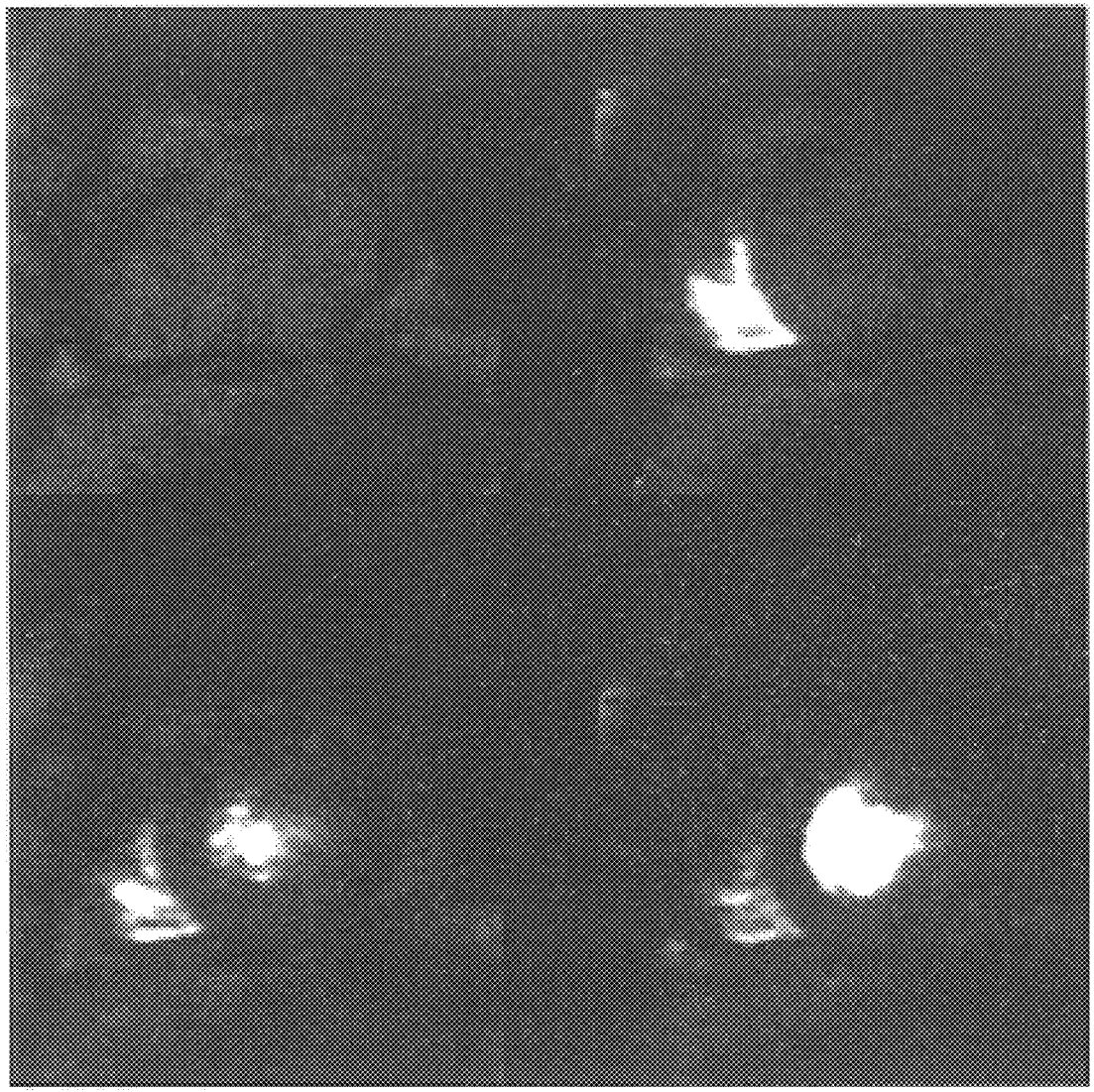
FIG. 8 is a series of first pass MDEFT myocardial perfusion images at 1.5 Tesla, (ti1/ti2=11/305 ms).

FIG. 8 shows first pass MDEFT myocardial perfusion images on a patient volunteer at 1.5 Tesla, (ti1/ti2=100/305 ms). The sequence can be easily implemented at 1.5 Tesla.

FIG. 8 demonstrates four short-axis view images from a set acquired during CA bolus first pass in a patient heart study conducted at 1.5 Tesla. The patient suffered from arrhythmias which resulted in arbitrary variations in the IR time curves that were absent in the MDEFT preparation scheme. With the elimination of the arrhythmia related fluctuations, the data are more suitable for analysis with more sophisticated perfusion models (see reference 13).

CONCLUSION

MDEFT prepared Ultra fast gradient recalled echo is an improved sequence for evaluation of the myocardial perfusion providing T1 contrast defined by the user and insensitivity to cardiac arrhythmias or failures of the triggering mechanism. The latter feature increases the applicability of the method to patients where arrhythmias are a major problem.

What is claimed is:

1. A method for obtaining myocardial images of a region of myocardial tissue using magnetic resonance imaging comprising the steps of:
    (a) selecting a region of myocardial tissue to image;
    (b) inducing an initial magnetic condition on the region of myocardial tissue being imaged before an imaging event, said condition comprising nulling of longitudinal magnetization,
    (c) allowing a ti1 relaxation time to pass,
    (d) acquiring data which consists essentially of longitudinal magnetization which evolved during ti1, and
    (e) creating an image from said sampling of data of the longitudinal magnetization.

2. The method of claim 1 wherein step (d) is acquiring data which consists of longitudinal magnetization evolved during ti1.

3. The method of claim 1 wherein longitudinal magnetization evolved during ti1 is encoded between steps (c) and (d).

4. The method of claim 2 longitudinal magnetization evolved during ti1 is encoded between steps (c) and (d).

5. The method of claim 1 wherein the nulling of the longitudinal magnetization is effected by at least one magnetic pulse and said nulling is triggered by a heartbeat.

6. The method of claim 2 wherein the nulling of the longitudinal magnetization is effected by at least one magnetic pulse.

7. The method of claim 3 wherein the nulling of the longitudinal magnetization is effected by at least one magnetic pulse triggered by a heartbeat.

8. The method of claim 7 wherein after said nulling pulse, a second magnetic pulse is applied to said region of myocardial tissue.

9. The method of claim 8 wherein the second magnetic pulse spoils the transverse magnetization generated by the nulling pulse.

10. The method of claim 8 comprising the step of applying a third magnetic pulse.

11. The method of claim 10 wherein the third magnetic pulse is an inverting pulse.

12. The method of claim 10 further comprising the step of applying a fourth magnetic pulse.

13. The method of claim 1 wherein transverse magnetization generated after nulling is crushed and longitudinal magnetization that evolves during ti1 is encoded for contrast.

14. The method of claim 2 wherein transverse magnetization generated after nulling is crushed and longitudinal magnetization that evolves during ti1 is encoded for contrast.

15. The method of claim 3 wherein transverse magnetization generated after nulling is crushed and longitudinal magnetization that evolves during ti1 is encoded for contrast.

16. The method of claim 10 wherein the step of applying the third magnetic pulse is done at a time ti1 after the step of applying a first magnetic pulse, and wherein the step of sampling the longitudinal magnetization is done at a time ti2 after the step of applying the third magnetic pulse.

17. The method of claim 16 wherein said time ti1 is unequal to said time ti2.

18. A method for obtaining data relating to myocardial images of a region of myocardial tissue using magnetic resonance imaging comprising the steps of:

(a) applying a nulling pulse to a region of the myocardial tissue to null the longitudinal magnetization;

(b) allowing a relaxation time ti1 to pass; and (c) sampling the longitudinal magnetization after the step of applying a nulling pulse to null the longitudinal magnetization, said sampling providing data relating to myocardial images.

19. The method of claim 18 wherein the step of applying the nulling pulse includes applying a 90 degree pulse.

20. The method of claim 19 wherein the 90 degree pulse is a square hard pulse.

21. The method of claim 19 wherein the 90 degree pulse is an amplitude modulated hard pulse.

22. The method of claim 19 wherein the 90 degree pulse is an adiabatic excitation pulse.

23. The method of claim 19 further comprising the step of applying a first spoiling pulse to spoil the transverse magnetization generated by the nulling pulse.

24. The method of claim 23 further comprising the step of applying an inverting pulse to invert the magnetization at a time ti1 after the nulling pulse, said inverting pulse being a 180 degree pulse.

25. The method of claim 24 further comprising the step of applying a second spoiling pulse to spoil the transverse magnetization generated by the inverting pulse.

26. The method of claim 24 further comprising the step of sampling the longitudinal magnetization at a time ti2 after the inverting pulse.

27. The method of claim 26 wherein ti1 is not equal to ti2.

28. A method for obtaining data of images of a region using magnetic resonance imaging, said method comprising the steps of:

applying a nulling pulse to null the longitudinal magnetization;

applying a first spoiling pulse to spoil the transverse magnetization generated by the nulling pulse;

applying an inverting pulse to invert the magnetization at a time ti1 after the nulling pulse;

applying a second spoiling pulse to spoil the transverse magnetization generated by the inverting pulse; and sampling the longitudinal magnetization to obtain data of an image after the step of applying the second spoiling pulse at a time ti2 after the inverting pulse, wherein ti1 is not equal to ti2.

29. The method of claim 28 wherein the pulses are applied to human tissue.

* * * * *